United States Patent [19]

Foner et al.

[11] 4,006,107

[45] Feb. 1, 1977

[54] METHOD OF PRODUCING TERNARY LEAD MOLYBDENUM SULFIDES

[75] Inventors: Simon Foner, Belmont; Edward J. McNiff, Jr.; Edwin J. Alexander, both of Danvers, all of Mass.

[73] Assignee: The United States of America as represented by the United States Energy Research and Development Administration, Washington, D.C.

[22] Filed: Aug. 13, 1975

[21] Appl. No.: 604,384

[52] U.S. Cl. .................. 252/518; 423/511; 252/62.3 V
[51] Int. Cl.² .................. C01B 17/00; H01L 39/00
[58] Field of Search .............. 252/62.3 R, 62.3 V, 252/518 R; 423/511

[56] References Cited
UNITED STATES PATENTS

| 3,653,849 | 4/1972 | Bither | 423/511 X |
| 3,801,702 | 4/1974 | Donohue | 252/62.3 V X |
| 3,933,990 | 1/1976 | Gentile | 423/511 X |

OTHER PUBLICATIONS

Odermutt et al., "J. Phys. C: Solid State Physics," vol. 7, Jan. 1974, pp. 13–14.
Morton et al., "Journal of Less Common Metals," 34 (1974), pp. 125–130.

*Primary Examiner*—Jack Cooper
*Attorney, Agent, or Firm*—Dean E. Carlson; Leonard Belkin

[57] ABSTRACT

The method of preparing $Pb_xMo_yS_z$ where $x = 0.8-1.1$, $y = 4.5-5.6$, and $z = 5.4-7.2$ comprising the steps of mixing commercial reagent grade powders of the reactants, heating in a sealed, evacuated reaction vessel to a temperature of 950°–1150° C, maintaining the temperature until the compound is formed, and then cooling the compound at a controlled rate not in excess of 4° C per minute.

3 Claims, No Drawings

METHOD OF PRODUCING TERNARY LEAD MOLYBDENUM SULFIDES

BACKGROUND OF THE INVENTION

The invention described herein was made in the course of, or under a contract with the National Science Foundation.

Synthesis of a series of compounds including ternary lead molybdenum sulfides was reported in "Sur de Nouvelles Phases Sulfurees Ternaires du Molybdene" by Chevrel et al., Journal of Solid State Chemistry 3, 515–519 (1971).

Subsequently it was reported by Matthias et al. in Science 175, 1465 (1972 that several of these compounds were superconducting In particular the compound having the composition $Mo_{5.1}Pb_{0.9}S_6$ was described as having a superconducting transition temperature Tc of 13.2–12.5 K. Neither Chevrel et al. nor Matthias et al. described in detail how the compounds were prepared.

Further work on these compounds was reported by other researchers in the field. Marezio et al. in "Superconductivity of Ternary Sulfides and the Structure of $PbMo_6S_8$", Mat. Res. Bull., Vol. 8, pp 657–668 (1973) apparently erroneously attributed to Matthias et al. in their publication the finding of Tc = 15.2 K for the lead molysulfide identified in the title. The paper does not describe in detail how the compounds were prepared except they were apparently made in stages, for example, preparing the lead sulfide first.

Odermatt et al. in a "Letter to the Editor", J. Phys. C: Solid State Physics, Vol. 7, 1974, L13–14, showed in a graph, FIG. 1, $Pb_{0.9}Mo_{5.1}S_6$ having an extropolated $H_{c2}$ of 450 kG. Preparation of the compound involved direct reaction of the constituents in evacuated quartz tubes at 1050° C for 24 hours followed by pressing and annealing.

Fischer et al. in a "Letter to the Editor", J. Phys. C: Solid State Phys., Vol. 7, 1974, L450–453, describes similar compounds, speculating that 600 kG can be obtained at 4.2K. These workers do not describe in detail how the compounds were made.

SUMMARY OF THE PRESENT INVENTION

It has been discovered that a specific class of ternary lead molybdenum sulfides prepared according to a specific process will produce a compound having a $T_c$ of at least about 12.3 K and an $H_{c2}$ of at least about 400 kG.

In accordance with the principles of this invention, the method involves the steps of mixing commercial reagent grade powders of lead, molybdenum, and sulfur in the atomic proportions of $pb_xMo_yS_z$, where $x = 0.8 –1.1$, $y = 4.5–5.6$, and $z = 5.4–7.2$, heating the mixture in a sealed, evacuated container whose volume is approximately no more than four times the volume occupied by the unpacked powder up to a temperature in the range of 950°–1150° C, maintaining the temperature until the compound is formed, and then cooling the compound to ambient temperature at a controlled rate not in excess of 4° C per minute.

It is thus a principal object of this invention to provide a method of producing a ternary compound of lead molybdenum sulfide having improved superconducting properties.

Other objects and advantages of this invention will hereinafter become obvious from the following description of preferred embodiments of this invention.

DESCRIPTION OF THE PREFERRED EMBODIMENTS

The starting ingredients are elemental and in powdered form, particle size ranging predominantly from 10–25 microns and of commercial reagent grade quality, that is, substantially pure.

The powdered starting materials weighed out in proper portions to give the starting composition of $Pb_xMo_yS_z$ where $x = 0.8–1.1$, $y = 4.5–5.6$ and $z = 5.4–7.2$ are mixed thoroughly without compressing or otherwise working and placed in a reaction vessel whose volume should not be in excess of about four times the volume of the unpacked mixed powders. This limitation insures complete reaction of the sulfur with the other constituents. The reaction vessel should be evacuated and all moisture removed before sealing the vessel.

The reaction vessel containing the mixed powders is then heated to a temperature within the range of 950°–1150° C and held there until the compound is formed. Typically at least a few hours is required, but the vessel may be held there for up to 24 hours or longer.

Cooling of the sealed reaction vessel down to ambient temperature is a critical step in this process. Quenching or too rapid cooling must be avoided. It has been found that the cooling rate should be limited to no more than 4° C per minute, and a rate of less than one degree per minute is preferred.

EXAMPLE

An initial powder sample was prepared by tumble mixing 5.1797 gms of Pb, 12.2324 gms of Mo, and 4.8096 gms of sulfur. The sulfur was commercial reagent grade supplied by J. T. Baker Chemical Company. The lead was from Alcan Co., MO-201 grade. The molybdenum was commercial reagent grade from Fisher Co. The particle size ranged from 10–25 microns generally. The atomic composition was $Pb_{1.0}Mo_{5.1}S_6$.

The mixture was placed in a quartz reaction vessel of 45 cc volume and evacuated to about $10^{-5}$ Torr and held there for about an hour prior to sealing to remove all mositure. The vessel was then sealed by fusing the tubulation closed.

The vessel was placed into a resistance heated oven and the temperature was raised to 1095° C over a period of about 4 hours. The temperature was held to its elevated value for 24 hours and then the vessel was cooled in the oven by a programmed cooling method which permitted the vessel temperature to decline by an average rate of 0.5° per minute down to ambient temperature. Cooling took about 30–33 hours.

The sample remained in powdered form and was tested for its crystal structure in an x-ray diffractometer which verified the appropriate crystal structure for the ternary compound.

The $T_c$ was 14.4 K for the final product as determined by an RF technique described in "Upper Critical Fields of $Nb_3Ge$ Thin Film Superconductor" by Foner et al. appearing in PHYSICS LETTERS, Vol. 47A, pp 485–486 May 6, 1974. The $T_c$ is an extrapolation to zero field of D.C. field measurements of the upper critical field vs. temperature curve. The $H_{c2}$ was approximately 510 kilogauss at 4.2 K as measured with a similar RF technique described in aforementioned citation employing a pulsed field system.

The example described above is given in greater detail and with graphical analysis in our "High Field Properties of Ternary Metal Molybdenum-Sulfides" appearing in IEEE Transactions on Magnetics, vol. MAG-11, no 2,155–158 March 1975 and our letter "600 kG Superconductors" in PHYSICS LETTERS Vol. 49A, 269–270, Sept. 23, 1974.

What is claimed:

1. A method of preparing a compound having a $T_c$ of at least about 12.3 K and an $H_{c2}$ of at least about 400 kG at 4.2 K comprising the steps of:

a. mixing commercial reagent grade powders of lead, molybdenum and sulfur in the atomic proportions of $Pb_xMo_yS_z$ where $z = 5.4$–$7.2$, $y = 4.5$–$5.6$, and $x = 0.8$–$1.1$;

b. heating the aforementioned mixture in a sealed, evacuated container to a temperature in the range of 950°–1150° C;

c. maintaining the temperature until the compound is formed; and d. cooling the compound to ambient temperature at a controlled rate not in excess of 4° C per minute.

2. The method of claim 1 in which the volume of the continer is no more than about four times the volume occupied by the unpacked powder.

3. The method of claim 2 in which the powders are mixed free of compression.

* * * * *